United States Patent
Horii

[11] Patent Number: 5,877,062
[45] Date of Patent: Mar. 2, 1999

[54] METHODS OF FORMING INTEGRATED CIRCUIT CAPACITORS HAVING PROTECTED DIFFUSION BARRIER METAL LAYERS THEREIN

[75] Inventor: Hideki Horii, Kyungki-do, Rep. of Korea

[73] Assignee: Samsung Electronics Co., Ltd., Suwon, Rep. of Korea

[21] Appl. No.: 969,395

[22] Filed: Nov. 13, 1997

[30] Foreign Application Priority Data

Nov. 13, 1996 [KR] Rep. of Korea ................. 1996 53824

[51] Int. Cl.$^6$ ................................. H01L 21/20
[52] U.S. Cl. .................. 438/396; 438/253; 438/650; 438/653; 438/240
[58] Field of Search ............ 148/DIG. 93; 205/96, 205/118; 438/240, 251, 253, 396, 642, 650, 653, 685, 686

[56] References Cited

U.S. PATENT DOCUMENTS

| | | | |
|---|---|---|---|
| 4,348,263 | 9/1982 | Draper et al. | 148/DIG. 93 |
| 4,466,177 | 8/1984 | Chao | 438/251 |
| 5,019,535 | 5/1991 | Wojnarowski et al. | 438/642 |
| 5,066,615 | 11/1991 | Brady et al. | 438/685 |
| 5,074,969 | 12/1991 | Brewer et al. | 205/118 |
| 5,122,477 | 6/1992 | Wolters et al. | 437/60 |
| 5,173,170 | 12/1992 | Brown et al. | 205/96 |
| 5,464,786 | 11/1995 | Figura et al. | 438/396 |
| 5,478,772 | 12/1995 | Fazan | 437/60 |
| 5,504,041 | 4/1996 | Summerfelt | 438/396 |
| 5,563,762 | 10/1996 | Leung et al. | 438/396 |
| 5,696,015 | 12/1997 | Hwang | 438/396 |

OTHER PUBLICATIONS

Hiromi Itoh et al., Integration Of BST Thin Film For DRAM Fabrication, Integrated Ferroelectrics, 1995, vol. 11, pp. 101–109, (No Month).

*Primary Examiner*—Charles Bowers
*Assistant Examiner*—Jack Chen
*Attorney, Agent, or Firm*—Myers Bigel Sibley & Sajovec

[57] ABSTRACT

Methods of forming integrated circuit capacitors include the steps of forming an electrically insulating layer having a contact hole therein, on a face of a semiconductor substrate and then forming a polysilicon contact plug in the contact hole. A first capacitor electrode is then formed in electrical contact with the polysilicon contact plug. The first capacitor electrode may be formed by etching a composite of a diffusion barrier metal layer containing a nitride material (or silicide material) and a first electrically conductive layer. Alternatively, the first capacitor electrode may be formed by etching the diffusion barrier metal layer without the first electrically conductive layer thereon. The diffusion barrier metal layer inhibits parasitic migration of silicon from the polysilicon plug to the first electrically conductive layer. A protective layer of a preferred material is then electroplated onto an upper surface and on sidewalls of the first capacitor electrode. The protective layer is designed to protect exposed sidewall portions of the barrier metal layer from being oxidized during subsequent process steps. Next, a capacitor dielectric layer is formed on the protective layer, opposite the upper surface of the first capacitor electrode. The capacitor dielectric layer is preferably formed of a high dielectric material such as a material selected from the group consisting of $Ta_2O_5$, $SrTiO_3$, $BaTiO_3$, $SrTiO_3$, $(Ba, Sr)TiO_3$, $Pb(Zr, Ti)O_3$, $SrBi_2Ta_2O_9$(SBT), $(Pb,La)(Zr, Ti)O_3$ and $Bi_4Ti_3O_{12}$.

20 Claims, 2 Drawing Sheets

METHODS OF FORMING INTEGRATED CIRCUIT CAPACITORS HAVING PROTECTED DIFFUSION BARRIER METAL LAYERS THEREIN

CROSS-REFERENCE TO RELATED APPLICATIONS

This application is related to application Ser. No. 08/969,803 entitled METHODS OF FORMING CAPACITOR ELECTRODES HAVING REDUCED SUSCEPTIBILITY TO OXIDATION AND CAPACITOR ELECTRODES FORMED THEREBY (Attorney Docket No. 5649-393) and application Ser. No. 08/969,672, entitled METHODS OF FORMING INTEGRATED CIRCUIT CAPACITORS USING METAL REFLOW TECHNIQUES (Attorney Docket No. 5649-413), filed concurrently herewith, the disclosures of which are hereby incorporated herein by reference.

FIELD OF THE INVENTION

The present invention relates to methods of forming integrated circuits, and more particularly to methods of forming capacitors for integrated circuits.

BACKGROUND OF THE INVENTION

It is generally desirable to make memory cells as small as possible so that more memory cells can be integrated into each chip. Higher capacitance storage capacitors also provide better definition when reading the memory cell, lower soft error rate, and enable lower voltage operation. Therefore, if memory cells can be made smaller and with higher capacitance, semiconductor memory devices can become more highly integrated.

Capacitors having three-dimensional structures have been proposed in an attempt to increase cell capacitance. These types of capacitors usually have a lower electrodes in the shape of a fin, a box, or a cylinder. However, the manufacturing processes for forming capacitors with three-dimensional electrode structures are complicated and defects may be easily generated during the manufacturing processes. Accordingly, research into the use of high dielectric materials for increasing the capacitance of capacitors is actively being conducted to avoid the need for forming capacitor electrodes having three-dimensional structure. However, when polysilicon doped with impurities is used as the lower electrode of a capacitor, the high dielectric layer may become susceptible to reaction with the polysilicon and this reaction may cause the formation of a parasitic dielectric layer having a relatively low dielectric constant at an interface between the lower electrode and the high dielectric layer. Accordingly, new electrodes which are less susceptible to reaction with high dielectric layers are required.

FIGS. 1 through 3 are sectional views illustrating a conventional method for manufacturing a capacitor of a semiconductor device. FIG. 1 shows the step of forming an interlayer dielectric layer pattern 20, a contact plug 30, a diffusion barrier layer 40 and a lower conductive layer 50. First, the interlayer dielectric layer pattern 20 having a contact hole therein for exposing a predetermined region of a semiconductor substrate 10, is formed on the semiconductor substrate 10. Then, a polysilicon layer is formed on the interlayer dielectric layer pattern 20 to fill the contact hole. The polysilicon layer is etched-back to expose the interlayer dielectric layer pattern 20, thereby forming the contact plug 30 filling the contact hole. Next, a diffusion barrier layer 40 and a lower conductive layer 50 are sequentially formed on the resultant structure. At this time, the diffusion barrier layer 40 is formed of titanium nitride, and the lower conductive layer 50 is formed of platinum (Pt) to inhibit the likelihood of reaction with a subsequently formed dielectric layer 60 (see FIG. 3). In particular, the diffusion barrier layer 40 is formed in order to prevent reaction between the contact plug 30 and the lower conductive layer 50 during the performance of a subsequent heat treatment process for forming the dielectric layer 60.

FIG. 2 shows the step of forming a diffusion barrier pattern 40a and a lower conductive layer pattern 50a. In detail, the lower conductive layer 50 and the diffusion barrier layer 40 are patterned to expose the interlayer dielectric layer pattern 20, and accordingly the diffusion barrier pattern 40a and the lower conductive layer pattern 50a which are sequentially stacked on the contact plug layer 30, are formed. This sequence of steps completes the lower electrode of the capacitor which consists of the contact plug layer 30, the diffusion barrier pattern 40a and the lower conductive layer pattern 50a.

FIG. 3 shows the step of completing the capacitor by forming a dielectric layer 60 and an upper conductive layer 70. In detail, the dielectric layer 60 (which may be formed of $Pb(Zr, Ti)O_3$) and the upper conductive layer 70 are sequentially formed over the completed lower electrode, to complete the capacitor. At this time, the dielectric layer 60 is formed in an oxygen atmosphere in order to prevent oxygen deficiency in the dielectric layer 60. If there is no diffusion barrier pattern 40a, during the heat treatment process for forming the dielectric layer 60 the contact plug 30 and the lower conductive layer pattern 50a may react with each other to form a platinum silicide layer. The dielectric layer 60 and the silicon in the platinum silicide layer may then react with each other to form a parasitic dielectric layer (having a low dielectric constant) between the dielectric layer 60 and the platinum silicide layer. Accordingly, the total capacitance may be reduced. Therefore, the diffusion barrier pattern 40a is typically necessary for inhibiting any interface reaction between the contact plug 30 and the lower conductive layer pattern 50a. However, during formation of the dielectric layer 60, the sidewalls of the diffusion barrier pattern 40a are exposed to an atmosphere of oxygen and may become oxidized. Accordingly, the resistance of the diffusion barrier pattern 40a may be substantially increased.

According to the conventional method for manufacturing a semiconductor device, the diffusion barrier pattern 40a prevents reaction between the contact plug 30 and the lower conductive layer pattern 50a. However, oxidation which may occur during the process of forming the dielectric layer 60 typically increases the electrical resistance of the diffusion barrier pattern 40a. Accordingly, the total resistance of the lower electrode of the capacitor may be greatly increased and therefore the possibility of high speed operation of devices containing the above described storage capacitors may be limited. Also, when the diffusion barrier pattern 40a is oxidized, a dielectric material having a low dielectric constant may be formed in series with the dielectric layer 60 to reduce the total capacitance.

SUMMARY OF THE INVENTION

It is therefore an object of the present invention to provide improved methods of forming integrated circuit storage capacitors.

It is another object of the present invention to provide methods of forming integrated circuit storage capacitors with reduced susceptibility to parasitic oxidation of protective barrier layers therein. It is still another object of the present invention to provide methods of forming integrated circuit storage capacitors having high capacitance with reduced lateral dimensions.

These and other objects, advantages and features of the present invention are provided by methods of forming integrated circuit capacitors which include the steps of forming an electrically insulating layer having a contact hole therein, on a face of a semiconductor substrate and then forming a polysilicon contact plug in the contact hole. A first capacitor electrode is then formed in electrical contact with the polysilicon contact plug. The first capacitor electrode may be formed by etching a composite of a diffusion barrier metal layer containing a nitride material (or silicide material) and a first electrically conductive layer. Alternatively, the first capacitor electrode may be formed by etching the diffusion barrier metal layer without the first electrically conductive layer thereon. The diffusion barrier metal layer inhibits parasitic migration of silicon from the polysilicon plug to the first electrically conductive layer. A protective layer of a preferred material is then formed on an upper surface and on sidewalls of the first capacitor electrode. The protective layer is designed to protect exposed sidewall portions of the barrier metal layer from being oxidized during subsequent process steps. Next, a capacitor dielectric layer is formed on the protective layer, opposite the upper surface of the first capacitor electrode. The capacitor dielectric layer is preferably formed of a high dielectric material such as a material selected from the group consisting of $Ta_2O_5$, $SrTiO_3$, $BaTiO_3$, $SrTiO_3$, $(Ba, Sr)TiO_3$, $Pb(Zr, Ti)O_3$, $SrBi_2Ta_2O_9$(SBT), $(Pb,La)(Zr, Ti)O_3$ and $Bi_4Ti_3O_{12}$.

According to a preferred embodiment of the present invention, the step of forming a protective layer comprises electroplating a protective layer onto the upper surface and exposed sidewalls of the first capacitor electrode. For example, the protective layer may be formed of a material selected from the group consisting of Ru, Ir, Pt, Os, W, Mo, Co, Ni, Au and Ag and the electroplating step may be performed by exposing the first capacitor electrode to a plating solution having a metallic salt therein which comprises a material selected from the group consisting of Ru, Ir, Pt, Os, W, Mo, Co, Ni, Au and Ag. In the event the first capacitor electrode comprises a patterned barrier metal layer (such as a patterned nitride layer) the protective layer may be electroplated directly onto an upper surface and sidewalls of the patterned nitride layer. Thus, the patterned barrier metal layer with electroplated protective layer thereon may collectively form a lower electrode of the storage capacitor.

BREIF DESCRIPTION OF THE DRAWINGS

The above objects and advantages of the present invention will become more apparent by describing in detail a preferred embodiment thereof with reference to the attached drawing(s) in which:

FIGS. 1 through 3 are cross-sectional views of intermediate structures that illustrate a conventional method of manufacturing a capacitor of a semiconductor device; and FIGS. 4 through 7 are cross-sectional views of intermediate structures that illustrate methods of manufacturing a capacitor of a semiconductor device according to an embodiment of the present invention.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. Like numbers refer to like elements throughout.

Figure 1:
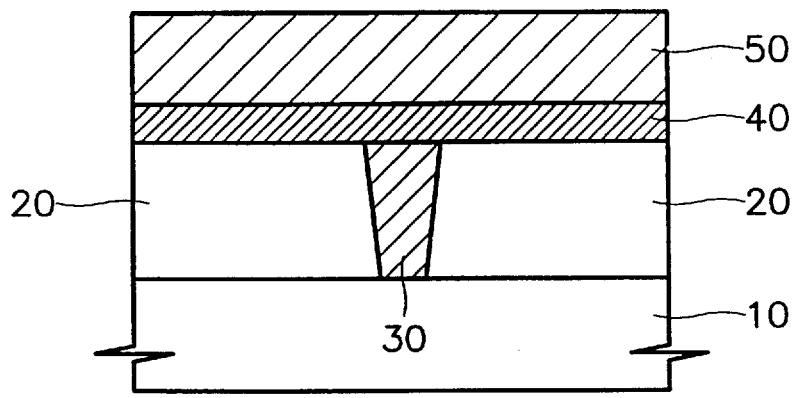
Figure 2:
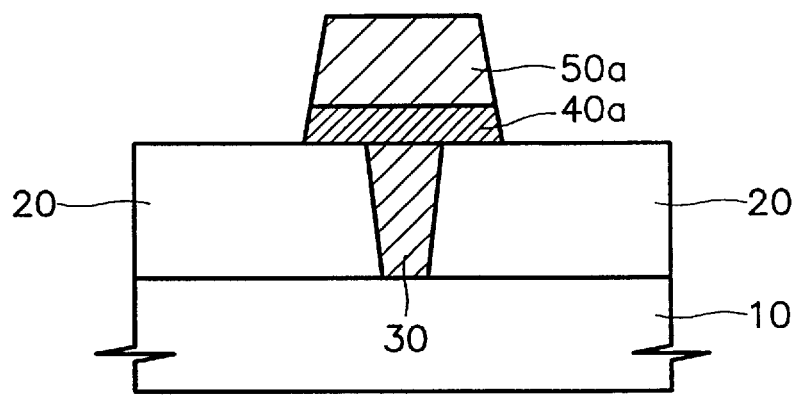
Figure 3:
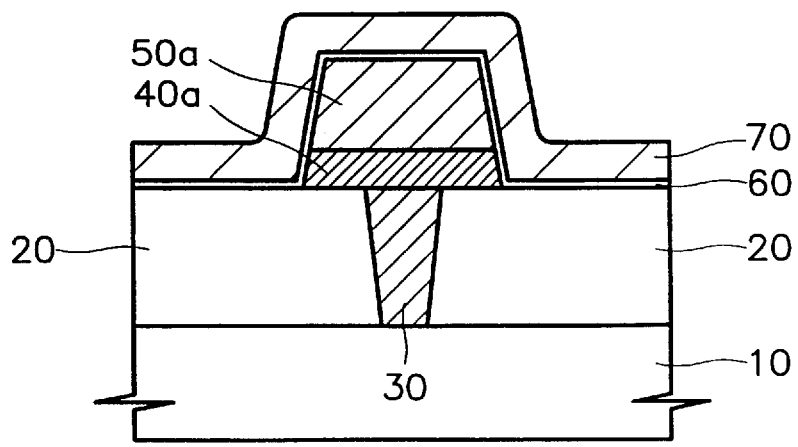
Figure 4:
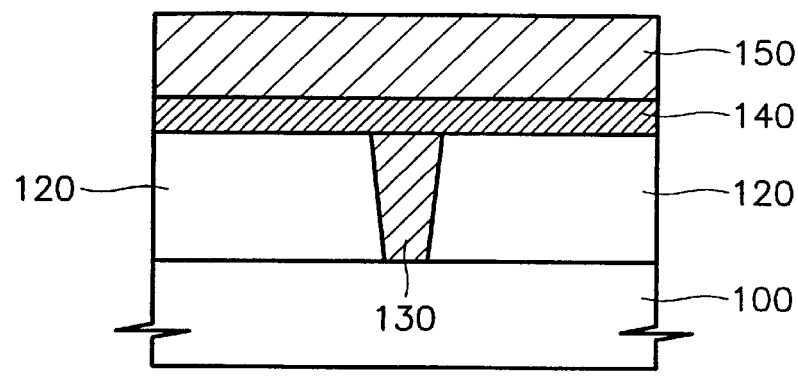

FIG. 4 shows the step of forming an interlayer dielectric layer pattern 120, a contact plug 130, a diffusion barrier layer 140 and a lower conductive layer 150. First, the interlayer dielectric layer pattern 120 having a contact hole therein for exposing a predetermined region of a semiconductor substrate 100, is formed on the semiconductor substrate 100. Then, a polysilicon layer (not shown) is formed on the interlayer dielectric layer pattern 120 to fill the contact hole. The polysilicon layer is then etched-back until the interlayer dielectric layer pattern 120 is exposed to form a contact plug 130. Next, the diffusion barrier layer 140 and the lower conductive layer 150 are sequentially formed on the interlayer dielectric layer pattern and on the contact plug 130. The diffusion barrier layer 140 may be formed of a nitride selected from the group consisting of TiN, TiAlN, TiSiN, TaSiN, TaAlN, WN and suicides thereof. The lower conductive layer 150 is preferably formed of a material selected from the group consisting of Ru, Ir, Pt, Os, Pd, W, Mo, Co and conductive oxides thereof. However, according to another embodiment of the present invention, the step of forming the lower conductive layer 150 may be omitted and a longer duration electroplating step (described below) may be performed to compensate for the missing lower conductive layer 150.

Figure 5:
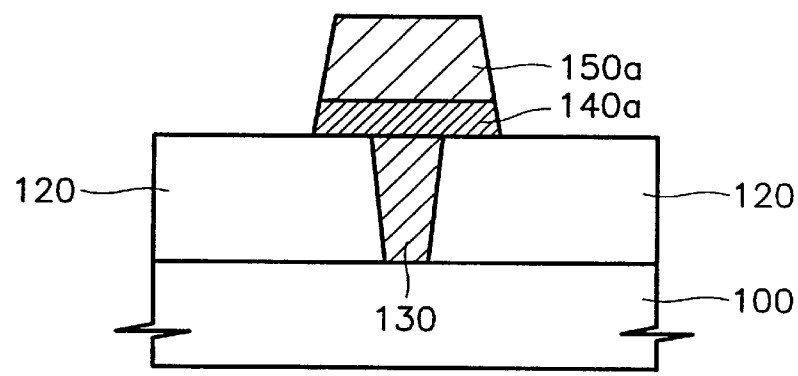

FIG. 5 shows the step of forming a diffusion barrier pattern 140a and a lower conductive layer pattern 150a. In detail, the lower conductive layer 150 and the diffusion barrier layer 140 are patterned to expose the interlayer dielectric layer pattern 120. Accordingly, the diffusion barrier pattern 140a and the lower conductive layer pattern 150a are formed on the interlayer dielectric layer pattern 120 and over the contact plug 130. This completes the lower electrode of the capacitor which consists of the contact plug 130, the diffusion barrier pattern 140a and the lower conductive layer pattern 150a.

Figure 6:
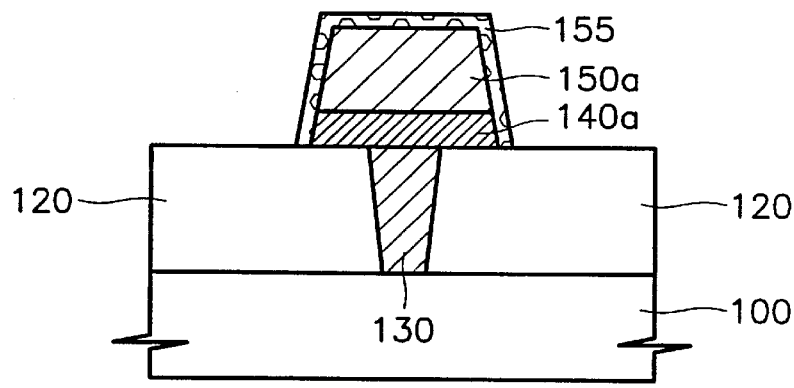

FIG. 6 shows the step of forming a protective layer pattern 155. In detail, a preferred electroplating step is performed in a plating solution having metallic salt which contains a material selected from a group consisting of Ru, Ir, Pt, Os, W, Mo, Co, Ni, Au and Ag. Here, the lower conductive layer pattern 150a and the diffusion barrier pattern 140a are used as an electroplating anode cathode. Thus, the protective layer pattern 155 comprises a material selected from the group consisting of Ru, Ir, Pt, Os, W, Mo, Co, Ni, Au and Ag. The duration of the electroplating step may be increased in the event the steps of forming the lower conductive layer pattern 150a are omitted.

For example, when an electroplating step is performed in a plating solution containing $RuNOCl_3$ as a metallic salt, a ruthenium (Ru) layer is not formed on the interlayer dielectric layer pattern 120 (which is an insulating material) but is preferably formed only on the lower conductive layer pattern 150a and the diffusion barrier pattern 140a. Accordingly, the protective layer pattern 155 is selectively formed on the lower conductive layer pattern 150a and the diffusion barrier pattern 140a. The protective layer pattern 155 preferably does not react with either oxygen or a subsequently formed dielectric layer 160 (see FIG. 7).

Figure 7:
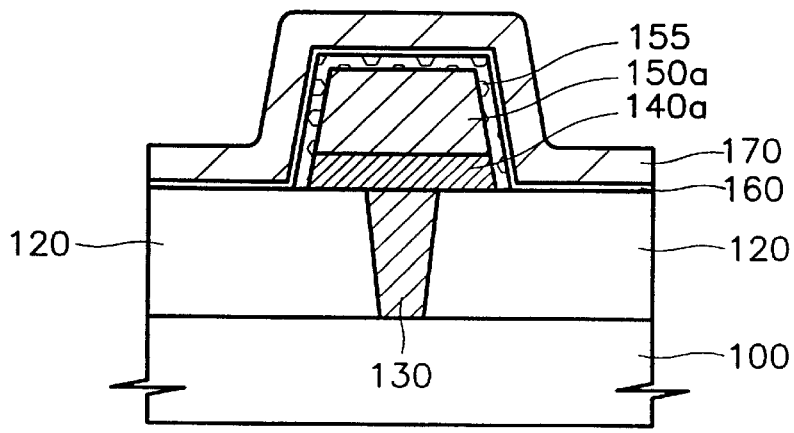

FIG. 7 shows the step of forming the dielectric layer 160 and an upper conductive layer 170. The dielectric layer 160 and the upper conductive layer 170 are sequentially formed on the resultant structure where the protective layer pattern 140a is formed, thereby completing the capacitor. Here, the dielectric layer 160 is preferably formed of a material selected from the group consisting of $Ta_2O_5$, $SrTiO_3$, $BaTiO_3$, $SrTiO_3$, $(Ba, Sr)TiO_3$, $Pb(Zr, Ti)O_3$, $SrBi_2Ta_2O_9$, (SBT), $(Pb,La)(Zr, Ti)O_3$ and $Bi_4Ti_3O_{12}$ and the upper conductive layer 170 may be formed of a metal or polysilicon, for example.

As described above, the diffusion barrier pattern 140a is completely covered by the lower conductive layer pattern 150a and the protective layer pattern 155. Accordingly, even though the dielectric layer 160 is formed in an oxygen atmosphere, the diffusion barrier pattern 140a is prevented from oxidizing. Also, since the lower conductive layer pattern 150a is protected by the protective layer pattern 155, the lower conductive layer pattern 150a does not react with the dielectric layer 160. Accordingly, the lower conductive layer pattern 150a can be formed using a large number of materials that might be reactive with the material comprising the dielectric layer 160. According to the above methods for manufacturing a capacitor of a semiconductor device, the protective layer pattern 155 is formed selectively on sidewalls of the lower electrode to prevent the lower electrode (e.g., diffusion barrier pattern 140a) from being oxidized. Also, the material for the lower conductive layer pattern 150a is prevented from reacting with the dielectric layer 160. This allows for a wider choice of materials to be used as the lower conductive layer pattern 150a and diffusion barrier pattern 140a.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit capacitor, comprising the steps of:

forming an electrically insulating layer on a face of a semiconductor substrate;

forming a first capacitor electrode on the electrically insulating layer;

selectively forming a protective layer in contact with an upper surface and sidewalls of the first capacitor electrode using an electroplating technique;

forming a capacitor dielectric layer on the protective layer, opposite the upper surface of the first capacitor electrode; and forming a second capacitor electrode on the capacitor dielectric layer, opposite the protective layer.

2. The method of claim 1, wherein said step of forming a first capacitor electrode comprises the steps of:

forming a diffusion barrier layer on the electrically insulating layer;

forming a first electrically conductive layer on the diffusion barrier layer; and patterning the diffusion barrier layer and the first electrically conductive layer to define a first capacitor electrode having exposed sidewalls.

3. The method of claim 2, wherein said step of forming a protective layer comprises electroplating a protective layer onto the upper surface and exposed sidewalls of the first capacitor electrode.

4. The method of claim 3, wherein said electroplating step comprises electroplating a protective layer comprising a material selected from the group consisting of Ru, Ir, Pt, Os, W, Mo, Co, Ni, Au and Ag onto the upper surface and exposed sidewalls of the first capacitor electrode.

5. The method of claim 4, wherein the diffusion barrier layer comprises a material selected from the group consisting of nitrides and silicides.

6. The method of claim 4, wherein the diffusion barrier layer comprises a material selected from the group consisting of TiN, TlAlN, TaSiN, TaAlN and WN.

7. The method of claim 1, wherein said step of forming a first capacitor electrode comprises forming a nitride diffusion barrier layer on the electrically insulating layer; and wherein said step of forming a protective layer comprises electroplating a protective layer comprising a material selected from the group consisting of Ru, Ir, Pt, Os, N, Mo, Co, Ni, Ar and Ag, directly onto an upper surface and sidewalls of the nitride diffusion barrier layer.

8. The method of claim 4, wherein the first electrically conductive layer comprises a material selected from the group consisting of Ru, Ir, Pt, Os, Pd, W, Mo and Co.

9. The method of claim 3, wherein said electroplating step comprises exposing the first capacitor electrode to a plating solution having a metallic salt therein which comprises a material selected from the group consisting of Ru, Ir, Pt, Os, W, Mo, Co, Ni, Au and Ag.

10. The method of claim 9, wherein the capacitor dielectric layer comprises a material selected from the group consisting of $Ta_2O_5$, $SrTiO_3$, $BaTiO_3$, $SrTiO_3$, $(Ba, Sr)TiO_3$, $Pb(Zr, Ti)O_3$, $SrBi_2Ta_2O_9$(SBT), $(Pb,La)(Zr, Ti)O_3$ and $Bi_4Ti_3O_{12}$.

11. A method of forming an integrated circuit capacitor, comprising the steps of:

forming an electrically insulating layer having a contact hole therein, on a face of a semiconductor substrate;

forming a polysilicon contact plug in the contact hole;

forming a first capacitor electrode in electrical contact with the polysilicon contact plug;

selectively forming a protective layer in contact with an upper surface and sidewalls of the first capacitor electrode usino an electroplatinrm technique;

forming a capacitor dielectric layer on the protective layer, opposite the upper surface of the first capacitor electrode; and forming a second capacitor electrode on the capacitor dielectric layer, opposite the protective layer.

12. The method of claim 11, wherein said step of forming a first capacitor electrode comprises the steps of:

forming a diffusion barrier layer on the polysilicon contact plug;

forming a first electrically conductive layer on the diffusion barrier layer, opposite the polysilicon contact plug; and patterning the diffusion barrier layer and the first electrically conductive layer to define a first capacitor electrode having exposed sidewalls.

13. The method of claim 12, wherein said step of forming a protective layer comprises electroplating a protective layer onto the upper surface and exposed sidewalls of the first capacitor electrode.

14. The method of claim 13, wherein said electroplating step comprises electroplating a protective layer comprising a material selected from the group consisting of Ru, Ir, Pt, Os, W, Mo, Co, Ni, Au and Ag onto the upper surface and exposed sidewalls of the first capacitor electrode.

15. The method of claim 14, wherein the diffusion barrier layer comprises a nitride layer.

16. The method of claim 14, wherein the diffusion barrier layer comprises a material selected from the group consisting of TiN, TiAlN, TaSiN, TaAlN and WN.

17. The method of claim 14, wherein the diffusion barrier layer comprises a silicide layer.

18. The method of claim 14, wherein the first electrically conductive layer comprises a material selected from the group consisting of Ru, Ir, Pt, Os, Pd, W, Mo and Co.

19. The method of claim 13, wherein said electroplating step comprises exposing the first capacitor electrode to a plating solution having a metallic salt therein which comprises a material selected from the group consisting of Ru, Ir, Pt, Os, W, Mo, Co, Ni, Au and Ag.

20. The method of claim 19, wherein the capacitor dielectric layer comprises a material selected from the group consisting of $Ta_2O_5$, $SrTiO_3$, $BaTiO_3$, $SrTiO_3$, $(Ba, Sr)TiO_3$, $Pb(Zr, Ti)O_3$, $SrBi_2Ta_2O_9(SBT)$, $(Pb,La)(Zr, Ti)O_3$ and $Bi_4Ti_3O_{12}$.

* * * * *